(12) United States Patent
Tao et al.

(10) Patent No.: US 10,170,610 B1
(45) Date of Patent: Jan. 1, 2019

(54) PSEUDOMORPHIC HIGH ELECTRON MOBILITY TRANSISTOR WITH LOW CONTACT RESISTANCE

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/922,951

(22) Filed: Mar. 16, 2018

(51) Int. Cl.
*H01L 29/778* (2006.01)
*H01L 29/45* (2006.01)
*H01L 29/66* (2006.01)

(52) U.S. Cl.
CPC ........ *H01L 29/7783* (2013.01); *H01L 29/452* (2013.01); *H01L 29/66462* (2013.01)

(58) Field of Classification Search
CPC ........... H01L 29/7783; H01L 29/66462; H01L 29/452

USPC .................. 257/194, 195, 506, 392; 438/167
See application file for complete search history.

(56) References Cited

U.S. PATENT DOCUMENTS

| | | | | |
|---|---|---|---|---|
| 2006/0289963 | A1* | 12/2006 | Asano | H01L 27/0605 257/506 |
| 2009/0026501 | A1* | 1/2009 | Maher | H01L 27/0605 257/195 |
| 2012/0256233 | A1* | 10/2012 | Cui | H01L 27/0248 257/195 |
| 2014/0138746 | A1* | 5/2014 | Abrokwah | H01L 29/66462 257/194 |

\* cited by examiner

*Primary Examiner* — Bo Fan
(74) *Attorney, Agent, or Firm* — Qualcomm Incorporated

(57) ABSTRACT

In certain aspects, a pseudomorphic high electron mobility transistor (pHEMT) comprises a substrate layer, a bottom barrier layer on the substrate layer, a channel layer on the bottom barrier layer, an upper barrier on the channel layer, and a source and a drain on the upper barrier layer. The source and the drain each has a cap layer, an Ohmic contact layer on the cap layer, and a metal contact layer on the Ohmic contact layer. The Ohmic contact layer has a smaller bandgap than the cap layer. The pHEMT further comprises a gate metal stack on the upper barrier layer.

17 Claims, 6 Drawing Sheets

| Ohmic Contact (e.g., InGaAs) 348 |
| Cap (e.g., GaAs) 342 |
| Upper Barrier (e.g., AlGaAs) 308 |
| Channel (e.g., InGaAs) 306 |
| Bottom Barrier (e.g., AlGaAs) 304 |
| Substrate (e.g., GaAs) 302 |

FIG. 3a

PSEUDOMORPHIC HIGH ELECTRON MOBILITY TRANSISTOR WITH LOW CONTACT RESISTANCE

BACKGROUND

Field

Aspects of the present disclosure relate to the semiconductor devices, and more particularly, to device structures and manufacturing methods for improving contact resistance of a pseudomorphic high electron mobility transistor (pHEMT).

Background

High electron mobility transistor (HEMT) is a field-effect transistor incorporating a junction between two materials with different band gaps (i.e., a heterojunction) as the channel instead of a doped region (as is generally the case for MOSFET). A commonly used material combination is GaAs with AlGaAs, though there is wide variation, dependent on the application of the device. Ideally, the two different materials used for a heterojunction would have same lattice constant (spacing between the atoms). In practice, the lattice constants are typically slightly different (e.g., AlGaAs on GaAs), resulting in crystal defects. A pseudomorphic high electron mobility transistor (pHEMT) uses an extremely thin layer of one of the materials—so thin that the crystal lattice simply stretches to fit the other material. This technique allows the construction of transistors with larger bandgap differences than otherwise possible, giving them better performance.

pHEMT transistors are able to operate at higher frequencies than ordinary transistors, up to millimeter wave frequencies, and are used in high-frequency products such as cell phones, satellite television receivers, voltage converters, and radar equipment. Advantages of pHEMTs are that they have high gain, high switching speeds, and extremely low noise value. The source and drain resistances of a pHEMT have impact not only on the maximum output current, but more importantly on the transconductance gm and in turn on the gain and the high frequency performance $f_T$. Source and drain contact resistances are important to the overall source and drain resistances of a pHEMT, and can become one of the performance limiting factors. Accordingly, it would be beneficial to provide device structures and manufacturing methods for improving contact resistances of a pHEMT.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a pseudomorphic high electron mobility transistor (pHEMT) comprises a substrate layer, a bottom barrier layer on the substrate layer, a channel layer on the bottom barrier layer, an upper barrier on the channel layer, and a source and a drain on the upper barrier layer. The source and the drain each has a cap layer, an Ohmic contact layer on the cap layer, and a metal contact layer on the Ohmic contact layer. The Ohmic contact layer has a smaller bandgap than the cap layer. The pHEMT further comprises a gate metal stack on the upper barrier layer.

In another aspect, a method comprises providing a stack of multiple semiconductor layers having a substrate layer, a bottom barrier layer on the substrate layer, a channel layer on the bottom barrier layer, an upper barrier layer on the channel layer, a cap layer on the upper barrier layer, and an Ohmic contact layer on the cap layer. The Ohmic contact layer has a smaller bandgap than the cap layer. The method further comprises etching the cap layer and the Ohmic contact layer to form a source terminal and a drain terminal of a pseudomorphic high electron mobility transistor (pHEMT); forming a gate metal stack between the source terminal and the drain terminal and on the upper barrier layer; and forming a source metal contact on the source terminal and a drain metal contact on the drain terminal for the pseudomorphic high electron mobility transistor (pHEMT).

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIGS. 3a-3c illustrate an exemplary process flow in making a pHEMT according to certain aspects of the present disclosure.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

GaAs-based high electron mobility transistors (HEMTs) and pseudomorphic HEMTs (pHEMTs) are rapidly replacing conventional MESFET technology in military and commercial applications requiring low noise figures and high gain, particularly at millimeter-wave frequencies, imaging, radar, and radio astronomy—any application where high gain and low noise at high frequencies are required. pHEMTs have shown current gain to frequencies greater than 600 GHz and power gain to frequencies greater than 1 THz. An important aspect of a pHEMT is its current gain and high frequency performance, both are affected by the source and drain resistances. Accordingly, reducing the source and drain resistances, including the source and drain contact resistances, is beneficial to the high performance of a pHEMT.

Figure 1:
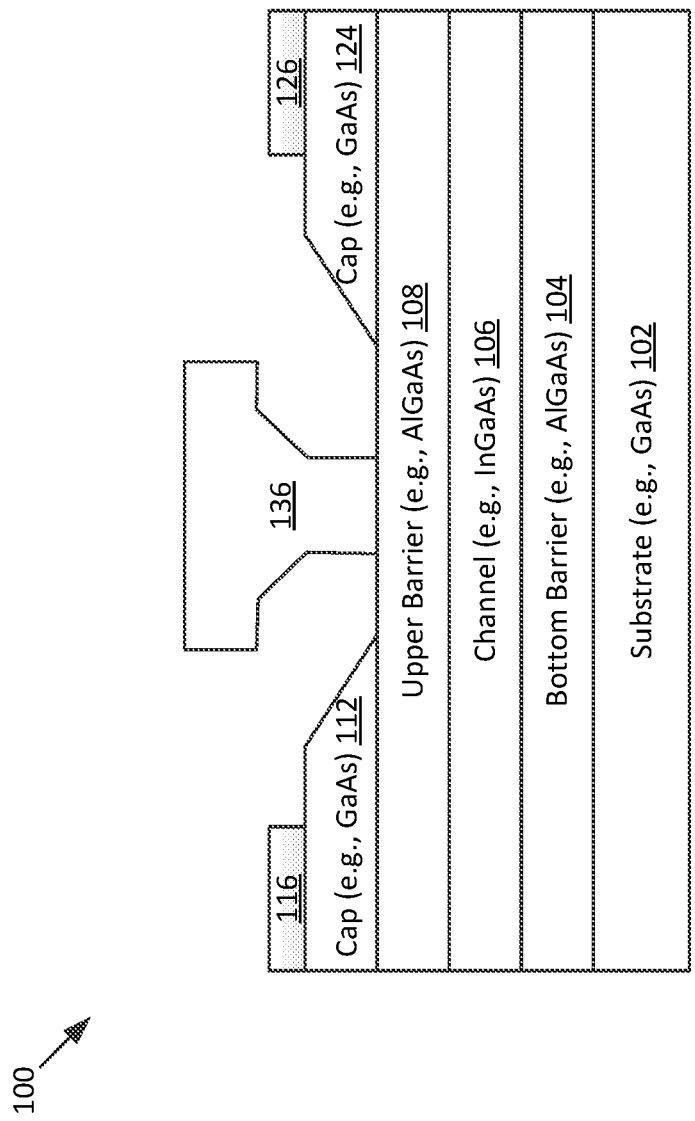
FIG. 1 illustrates an example pHEMT cross section according to certain aspects of the present disclosure.

FIG. 1 illustrates an example pHEMT cross section according to certain aspects of the present disclosure. The pHEMT 100 comprises a substrate layer 102, a bottom barrier layer 104 on the substrate layer 102, a channel layer 106 on the bottom barrier layer 104, and an upper barrier layer 108 on the channel layer 106. The substrate layer 102, the bottom barrier layer 104, the channel layer 106, and the upper barrier layer are semiconductor materials, typically comprising of III-V compound semiconductor materials. For example, the substrate layer 102 may be GaAs; the bottom barrier layer 104 and the upper barrier layer 108 both may be AlGaAs; and the channel layer 106 may be InGaAs.

The pHEMT 100 further comprises a source terminal, a drain terminal, and a gate terminal. The source terminal includes a source cap layer 112 on the upper barrier layer 108 and a source metal contact 116 on the source cap layer 112. The drain terminal includes a drain cap layer 124 on the upper barrier layer 108 and a drain metal contact 126 on the drain cap layer 124. The gate terminal includes a gate metal stack 136 on the upper barrier layer 108. For lattice matching, the source cap layer 112 and the drain cap layer 124 are typically GaAs. The source metal contact 116, the drain metal contact 126, or the gate metal stack 136 may be Al, Cu, or other suitable materials.

GaAs has relatively large bandgap. Placing the source metal contact 116 and the drain metal contact 126 directly on the source cap layer 112 and the drain cap layer 124 respectively may result in relatively large source and drain contact resistances. Therefore, it would be beneficial to provide a transitional low bandgap material between the source metal contact 116 and the drain metal contact 126 and the source cap layer 112 and the drain cap layer 124, respectively.

Figure 2:
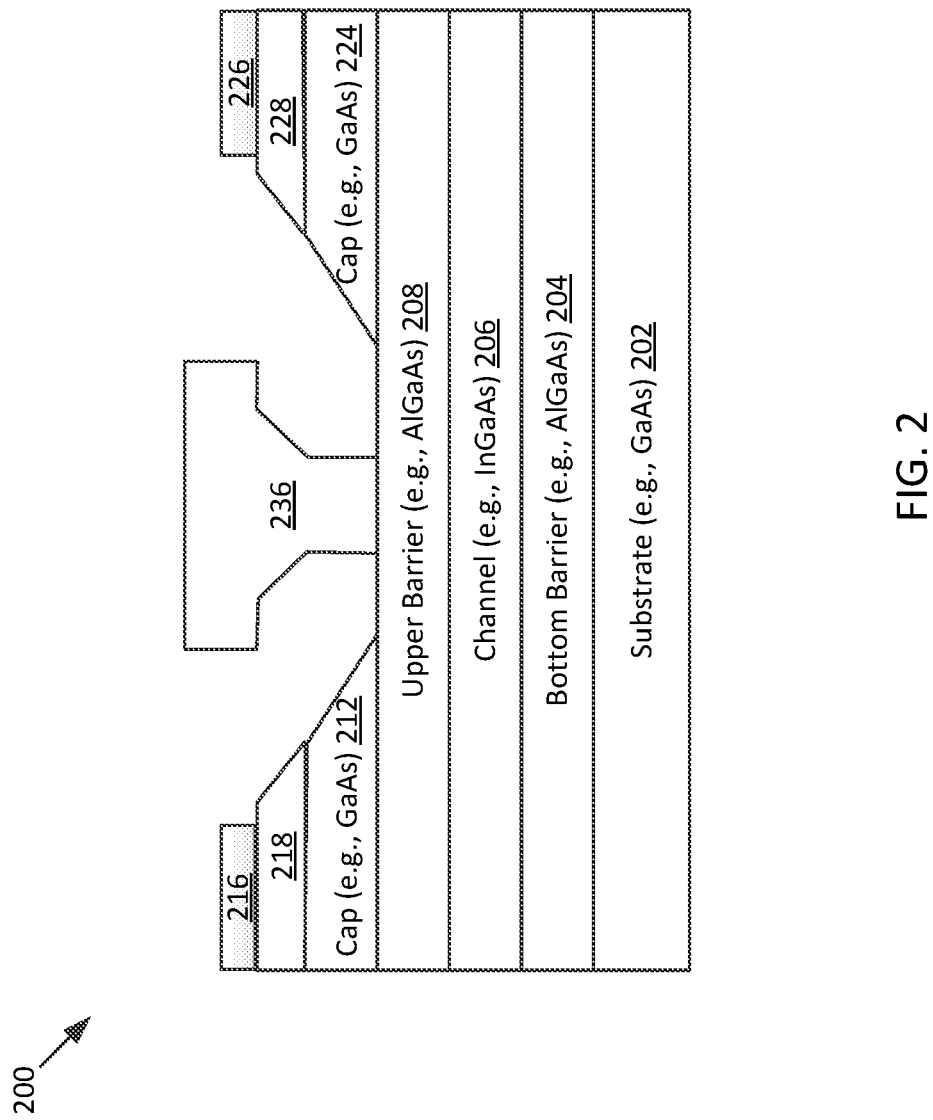
FIG. 2 illustrates an exemplary pHEMT cross section according to certain aspects of the present disclosure.

FIG. 2 illustrates an exemplary pHEMT cross section according to certain aspects of the present disclosure. The pHEMT 200 comprises a substrate layer 202, a bottom barrier layer 204 on the substrate layer 202, a channel layer 206 on the bottom barrier layer 204, and an upper barrier layer 208 on the channel layer 206. The substrate layer 202, the bottom barrier layer 204, the channel layer 206, and the upper barrier layer are semiconductor materials, typically comprising of III-V compound semiconductor materials. For example, the substrate layer 202 may be GaAs; the bottom barrier layer 204 and the upper barrier layer 208 both may be AlGaAs; and the channel layer 206 may be InGaAs.

The pHEMT 200 also comprises a source terminal, a drain terminal, and a gate terminal. The gate terminal includes a gate metal stack 236 on the upper barrier layer 208. The source terminal includes a source cap layer 212 on the upper barrier layer 208, a source Ohmic contact 218 on the source cap layer 212, and a source metal contact 216 on the source Ohmic contact 218. The drain terminal includes a drain cap layer 224 on the upper barrier layer 108, a drain Ohmic contact 228 on the drain cap layer 224, and a drain metal contact 226 on the drain Ohmic contact 228. For lattice matching, the source cap layer 222 and the drain cap layer 224 are typically GaAs. The source metal contact 216, the drain metal contact 226, or the gate metal stack 236 may be Al, Cu, or other suitable materials. The source Ohmic contact 218 and the drain Ohmic contact 228 are transitional low bandgap material to improve the contact resistances to the source metal contact 216 and the drain metal contact 226. The transitional low bandgap may be $In_xGa_{1-x}As$, where x indicates the atomic fraction of Indium (In) in the alloy and can be in the range of 0 to 1.0. The $In_xGa_{1-x}As$ has smaller bandgap and higher mobility than GaAs, making it an excellent material for metal contacts.

To minimize the lattice mismatch and reduce the strain, the $In_xGa_{1-x}As$ may be graded from the bottom to the top of the source Ohmic contact 218 and the drain Ohmic contact 228 by increasing the amount of Indium (In), or increasing the value of x. For example, the bottom of the source Ohmic contact 218 and the drain Ohmic contact 228 may be GaAs with x=0. The value of x increases from the bottom to the top of the source and drain Ohmic contacts 218 and 228. The value of x at the top of the source and drain Ohmic contacts 218 and 228 may be 1.0 or less than 1.0, such as 0.6.

Figure 3B:
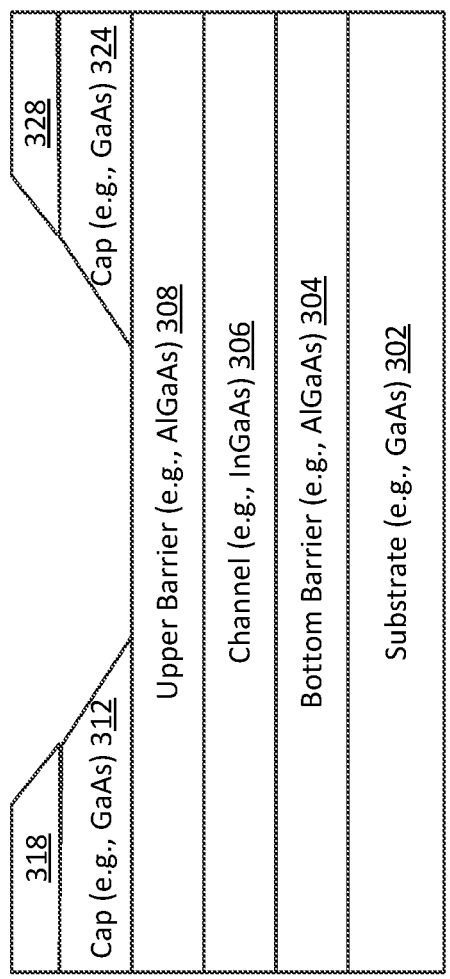
Figure 3C:
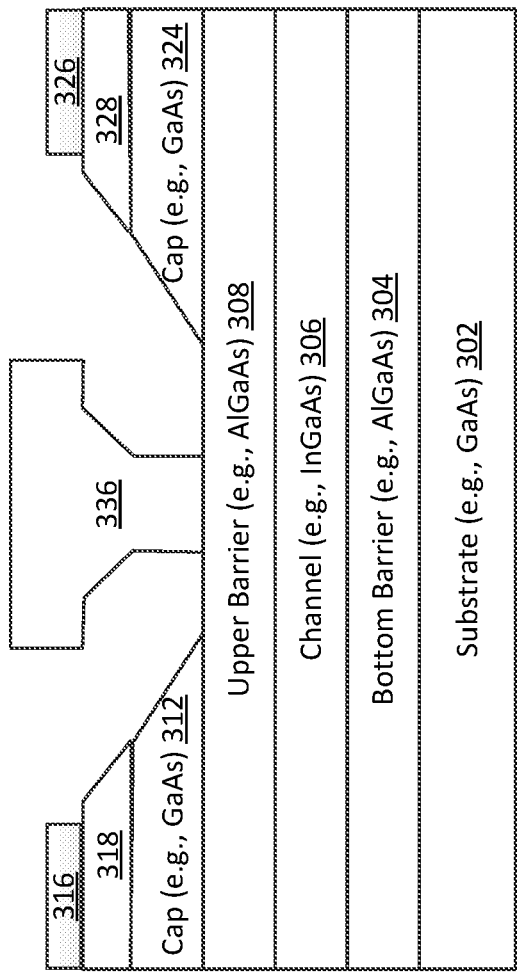

FIGS. 3a-3c illustrate an exemplary process flow in making a pHEMT according to certain aspects of the present disclosure. In FIG. 3a, a stack of multiple semiconductor layers is provided. The stack comprises a substrate layer 302, a bottom barrier layer 304 on the substrate layer 302, a channel layer 306 on the bottom barrier layer 304, an upper barrier layer 308 on the channel layer 306, a cap layer 342 on the upper barrier layer 308, and an Ohmic contact layer 348 on the cap layer 342. Some or all of the layers may be grown by epi technology. The substrate layer 302 may comprise an intrinsic GaAs. The bottom barrier layer 304 and the upper barrier layer 308 may comprise AlGaAs. The channel layer 306 may comprise InGaAs. The cap layer 342 may comprise GaAs. The Ohmic contact layer 348 may comprise graded $In_xGa_{1-x}As$, where x indicates the atomic fraction of Indium (In) in the alloy and can be in the range of 0 to 1.0. The $In_xGa_{1-x}As$ has smaller bandgap and higher mobility than GaAs, making it an excellent material for metal contacts. The amount of Indium (In) is graded from small (e.g., x=0) from the bottom of the Ohmic contact layer 348 to large (e.g., x=0.6 or 1.0) at the top of the Ohmic contact layer 348.

In FIG. 3b, etching is performed on the cap layer 342 and the Ohmic contact layer 348. Leaving only the source cap layer 312 and the source Ohmic contact 318 as the source terminal of a pHEMT and the drain cap layer 324 and the drain Ohmic contact 328 as the drain terminal of the pHEMT.

In FIG. 3c, a gate metal stack 336 is formed between the source terminal and the drain terminal and on the upper barrier layer 308. A source metal contact 316 is formed on the source Ohmic contact 318. A drain metal contact 326 is formed on the drain Ohmic contact 328.

Figure 4:
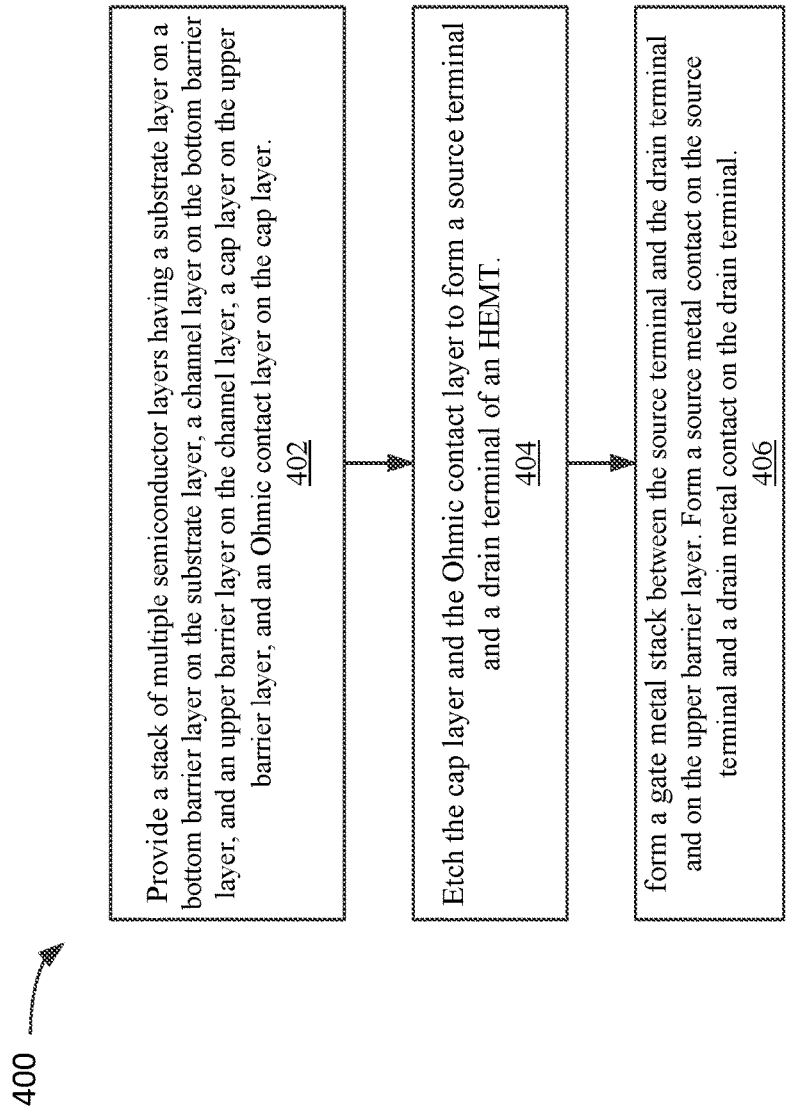
FIG. 4 illustrates an exemplary method of making a pHEMT according to certain aspects of the present disclosure.

FIG. 4 illustrates an exemplary method 400 of making a pHEMT according to certain aspects of the present disclosure. At 402, a stack of multiple semiconductor layers is provided. The stack includes a substrate layer (e.g., the substrate layer 302), a bottom barrier layer (e.g., the bottom barrier layer 304) on the substrate layer, a channel layer (e.g., the channel layer 306) on the bottom barrier layer, an upper barrier layer (e.g., the upper barrier layer 308) on the channel layer, a cap layer (e.g., the cap layer 342) on the upper barrier layer, and an Ohmic contact layer (e.g., the Ohmic contact layer 348) on the cap layer. The Ohmic contact layer may comprise graded $In_xGa_{1-x}As$, where x indicates the atomic fraction of Indium (In) in the alloy and can be in the range of 0 to 1.0. The $In_xGa_{1-x}As$ has much smaller bandgap and higher mobility than GaAs, making it excellent material for metal contacts. The amount of Indium (In) is graded from small (e.g., x=0) from the bottom of the Ohmic contact layer to large (e.g., x=0.6 or 1.0) at the top of the Ohmic contact layer.

At 404, patterning and etching is performed on the cap layer and the Ohmic contact layer. This leaves only a portion of the cap layer and the Ohmic contact layer to form a source terminal and a drain terminal of a pHEMT.

At 406, a gate metal stack is formed between the source terminal and the drain terminal and on the upper barrier layer. In addition, a source metal contact is formed on the source terminal and the drain metal contact is formed on the drain terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A pseudomorphic high electron mobility transistor (pHEMT), comprising:
    a substrate layer;
    a bottom barrier layer on the substrate layer;
    a channel layer on the bottom barrier layer;
    an upper barrier layer on the channel layer;
    a source and a drain on the upper barrier layer, each having a cap layer, an Ohmic contact layer on the cap layer, and a metal contact layer on the Ohmic contact layer, wherein the Ohmic contact layer has a smaller bandgap than the cap layer and comprises $In_xGa_{1-x}As$, wherein the value of x increases from the bottom of the Ohmic contact layer to the top of the Ohmic contact layer; and
    a gate metal stack on the upper barrier layer.

2. The pseudomorphic high electron mobility transistor (pHEMT) of claim 1, wherein the substrate layer comprises GaAs.

3. The pseudomorphic high electron mobility transistor (pHEMT) of claim 1, wherein the upper barrier layer comprises AlGaAs.

4. The pseudomorphic high electron mobility transistor (pHEMT) of claim 1, wherein the cap layer comprises GaAs.

5. The pseudomorphic high electron mobility transistor (pHEMT) of claim 1, wherein x is in a range of 0 to 1.0.

6. The pseudomorphic high electron mobility transistor (pHEMT) of claim 5, wherein x is in a range of 0 to 0.6.

7. The pseudomorphic high electron mobility transistor (pHEMT) of claim 1, wherein x=1 at the top of the ohmic contact layer.

8. The pseudomorphic high electron mobility transistor (pHEMT) of claim 1, wherein x=0 at the bottom of the ohmic contact layer.

9. A method, comprising:
    providing a stack of multiple semiconductor layers having a substrate layer, a bottom barrier layer on the substrate layer, a channel layer on the bottom barrier layer, an upper barrier layer on the channel layer, a cap layer on the upper barrier layer, and an Ohmic contact layer on the cap layer, wherein the Ohmic contact layer has a smaller bandgap than the cap layer;
    etching the cap layer and the Ohmic contact layer to form a source terminal and a drain terminal of a pseudomorphic high electron mobility transistor (pHEMT);
    forming a gate metal stack between the source terminal and the drain terminal and on the upper barrier layer; and
    forming a source metal contact on the source terminal and a drain metal contact on the drain terminal for the pseudomorphic high electron mobility transistor (pHEMT).

10. The method of claim 9, wherein the substrate layer comprises GaAs.

11. The method of claim 9, wherein the upper barrier layer comprises AlGaAs.

12. The method of claim 9, wherein the cap layer comprises GaAs.

13. The method of claim 9, wherein the Ohmic contact layer comprises $In_xGa_{1-x}As$, wherein x is in a range of 0 to 1.

14. The method of claim 13, wherein x is in a range of 0 to 0.6.

15. The method of claim 13, wherein the value of x increases from small at the bottom of the Ohmic contact layer to large at the top of the Ohmic contact layer.

16. The method of claim 15, wherein x=1 at the top of the ohmic contact layer.

17. The method of claim 15, wherein x=0 at the bottom of the ohmic contact layer.

* * * * *